US009595636B2

(12) United States Patent
Shatalov et al.

(10) Patent No.: US 9,595,636 B2
(45) Date of Patent: Mar. 14, 2017

(54) LIGHT EMITTING DEVICE SUBSTRATE WITH INCLINED SIDEWALLS

(71) Applicant: Sensor Electronic Technology, Inc., Columbia, SC (US)

(72) Inventors: Maxim S Shatalov, Columbia, SC (US); Jianyu Deng, Lexington, SC (US); Alexander Dobrinsky, Providence, RI (US); Xuhong Hu, Lexington, SC (US); Remigijus Gaska, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 408 days.

(21) Appl. No.: 13/852,487

(22) Filed: Mar. 28, 2013

(65) Prior Publication Data

US 2013/0260490 A1     Oct. 3, 2013

Related U.S. Application Data

(60) Provisional application No. 61/617,022, filed on Mar. 28, 2012.

(51) Int. Cl.
*H01L 33/20*     (2010.01)
*H01L 33/22*     (2010.01)
*H01L 33/00*     (2010.01)

(52) U.S. Cl.
CPC .......... *H01L 33/20* (2013.01); *H01L 33/0095* (2013.01); *H01L 33/22* (2013.01)

(58) Field of Classification Search
None
See application file for complete search history.

(56) References Cited

U.S. PATENT DOCUMENTS 5,916,460 A * 6/1999 Imoto ................... B23K 26/12
                                                         219/121.67
6,177,761 B1   1/2001 Pelka et al.
(Continued)

FOREIGN PATENT DOCUMENTS

EP     2161762 A1    3/2010
JP     2005158971    6/2005

OTHER PUBLICATIONS

J. Shakya, K. H. Kim, J. Y. Lin, and H. X. Jiang, "Enhanced light extraction in III-nitride ultraviolet photonic crystal light-emitting diodes," Applied Physics Letters, vol. 85, No. 1, p. 142-144, 2004.

(Continued)

*Primary Examiner* — Andres Munoz
(74) *Attorney, Agent, or Firm* — LaBatt, LLC

(57) ABSTRACT

A light emitting device having improved light extraction is provided. The light emitting device can be formed by epitaxially growing a light emitting structure on a surface of a substrate. The substrate can be scribed to form a set of angled side surfaces on the substrate. For each angled side surface in the set of angled side surfaces, a surface tangent vector to at least a portion of each angled side surface in the set of angled side surfaces forms an angle between approximately ten and approximately eighty degrees with a negative of a normal vector of the surface of the substrate. The substrate can be cleaned to clean debris from the angled side surfaces.

18 Claims, 22 Drawing Sheets

(56) References Cited

U.S. PATENT DOCUMENTS

| | | | |
|---|---|---|---|
| 6,229,160 | B1 | 5/2001 | Krames et al. |
| 6,323,063 | B2 | 11/2001 | Krames et al. |
| 6,570,190 | B2 | 5/2003 | Krames et al. |
| 6,844,572 | B2 | 1/2005 | Sawaki et al. |
| 6,902,990 | B2 | 6/2005 | Gottfried et al. |
| 6,939,730 | B2 | 9/2005 | Goto et al. |
| 6,969,627 | B2 | 11/2005 | Pan et al. |
| 7,205,578 | B2 * | 4/2007 | Eisert et al. .................... 257/98 |
| 7,268,371 | B2 | 9/2007 | Krames et al. |
| 7,446,344 | B2 * | 11/2008 | Fehrer et al. .................. 257/95 |
| 7,579,202 | B2 | 8/2009 | Hsu et al. |
| 7,601,621 | B2 | 10/2009 | Choi et al. |
| 7,781,246 | B2 | 8/2010 | Kim et al. |
| 8,101,447 | B2 | 1/2012 | Lin et al. |
| 2002/0127824 | A1 | 9/2002 | Shelton et al. |
| 2003/0197191 | A1 * | 10/2003 | Nitta ................... H01L 33/20 257/99 |
| 2005/0093016 | A1 * | 5/2005 | Yamamoto et al. .......... 257/103 |
| 2008/0128730 | A1 | 6/2008 | Fellows et al. |
| 2009/0057708 | A1 * | 3/2009 | Abdul Karim et al. ...... 257/100 |
| 2009/0159870 | A1 | 6/2009 | Lin et al. |
| 2009/0321748 | A1 | 12/2009 | Lee |
| 2010/0019265 | A1 | 1/2010 | Sormani et al. |
| 2010/0159622 | A1 * | 6/2010 | Hsieh et al. .................... 438/29 |

OTHER PUBLICATIONS

K. N. Hui, K. S. Hui, H. Lee, D.-H. Hwang, and Y.-G. Son, "Enhanced light output of angled sidewall light-emitting diodes with reflective silver films," Thin Solid Films, vol. 519, No. 8, pp. 2504-2507, Feb. 2011. [Change].

C.-C. Sun, C.-Y. Lin, T.-X. Lee, and T.-H. Yang, "Enhancement of light extraction of GaN-based light-emitting diodes with a microstructure array," Optical Engineering, vol. 43, No. 8, p. 1700-01, 2004.

A. Murai, D. B. Thompson, H. Masui, N. Fellows, U. K. Mishra, S. Nakamura, and S. P. DenBaars, "Hexagonal pyramid shaped light-emitting diodes based on ZnO and GaN direct wafer bonding," Applied Physics Letters, vol. 89, No. 17, p. 171116, 2006.

K. Streubel, N. Linder, R. Wirth, and A. Jaeger, "High brightness AlGaInP light-emitting diodes," IEEE Journal of Selected Topics in Quantum Electronics, vol. 8, No. 2, pp. 321-332, Apr. 2002.

H. G. Kim, H. K. Kim, H. Y. Kim, J. H. Ryu, J. hye Kang, N. Han, P. Uthirakumar, D. H. Yu, and C.-H. Hong, "InGaN/GaN Light-Emitting Diodes with Overcut-Shaped Periodic Microstructures Formed by Wet Etching Process," Electrochemical and Solid-State Letters, vol. 12, No. 8, p. H299-H301, 2009.

X. H. Wang, P. T. Lai, and H. W. Choi, "Laser micromachining of optical microstructures with inclined sidewall profile," Journal of Vacuum Science & Technology B: Microelectronics and Nanometer Structures, vol. 27, No. 3, p. 1048-52, 2009.

M. R. Krames, M. Ochiai-Holcomb, G. E. Höfler, C. Carter-Coman, E. I. Chen, I.-H. Tan, P. Grillot, N. F. Gardner, H. C. Chui, J.-W. Huang, S. A. Stockman, F. A. Kish, M. G. Craford, T. S. Tan, C. P. Kocot, M. Hueschen, J. Posselt, B. Loh, G. Sasser, and D. Collins, "High-power truncated-inverted-pyramid ($Al_x Ga_{1-x})_{0.5} In_{0.5} P$/GaP light-emitting diodes exhibiting >50% external quantum efficiency," Applied Physics Letters, vol. 75, No. 16, p. 2365-67, 1999.

K. C. Chen, Y. K. Su, C.-L. Lin, and H. C. Hsu, "Laser Scribing of Sapphire Substrate to Increase Side Light Extraction of GaN-Based Light Emitting Diodes," Journal of Lightwave Technology, vol. 29, No. 13, pp. 1907-1912, Jul. 2011.

T.-X. Lee, K.-F. Gao, W.-T. Chien, and C.-C. Sun, "Light extraction analysis of GaN-based light-emitting diodes with surface texture and/or patterned substrate," Optics Express, vol. 15, No. 11, p. 6670-76, 2007.

R.-H. Horng, Y.-A. Lu, and D.-S. Wuu, "Light Extraction Study on Thin-Film GaN Light-Emitting Diodes With Electrodes Covering by Wafer Bonding and Textured Surfaces," IEEE Transactions on Electron Devices, vol. 57, No. 10, pp. 2651-2654, Oct. 2010.

G. Y. Mak, E. Y. Lam, and H. W. Choi, "Liquid-immersion laser micromachining of GaN grown on sapphire," Applied Physics A, vol. 102, No. 2, pp. 441-447, Dec. 2010.

O. Shmatov and Z. S. Li, "Truncated-inverted-pyramid light emitting diode geometry optimisation using ray tracing technique," IEE Proceedings—Optoelectronics, vol. 150, No. 3, p. 273-77, 2003.

S. J. Lee, "Efficiency improvement in light-emitting diodes based on geometrically deformed chips," Proc. SPIE 3621, 237 (1999), pp. 237-248.

Zukauskas et al., "Solid State Lighting", pp. 1-132, Copyright © Wiley (2002), http://nina.ecse.rpi.edu/shur/.

Schubert et al., "Solid-State Light Sources Getting Smart ", pp. 1273-1278, Science, vol. 308, May 27, 2005, www.sciencemag.org.

E. Fred Schubert, "Light-Emitting Diodes", pp. 145-190, Cambridge, University, Cambridge, New York, 2006.

E. Fred Schubert et al., "Solid-State Lighting-a Benevolent Technology", Reports on Progress in Physics 69, pp. 3069-3099, 2006.

M. Ochiai-Holcomb, High-power truncated-inverted-pyramid Proc. SPIE, vol. 3938, 77 (2000), pp. 77-81.

Park, International Search Report and Written Opinion for International Application No. PCT/US2013/034288, Jun. 28, 2013, 12 pages.

* cited by examiner

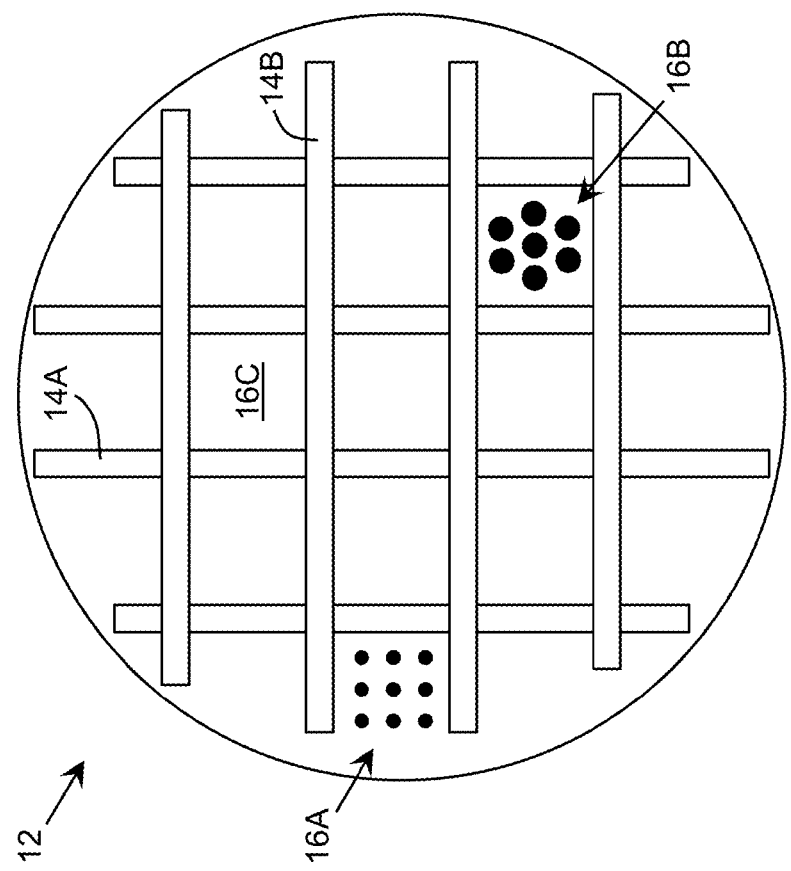

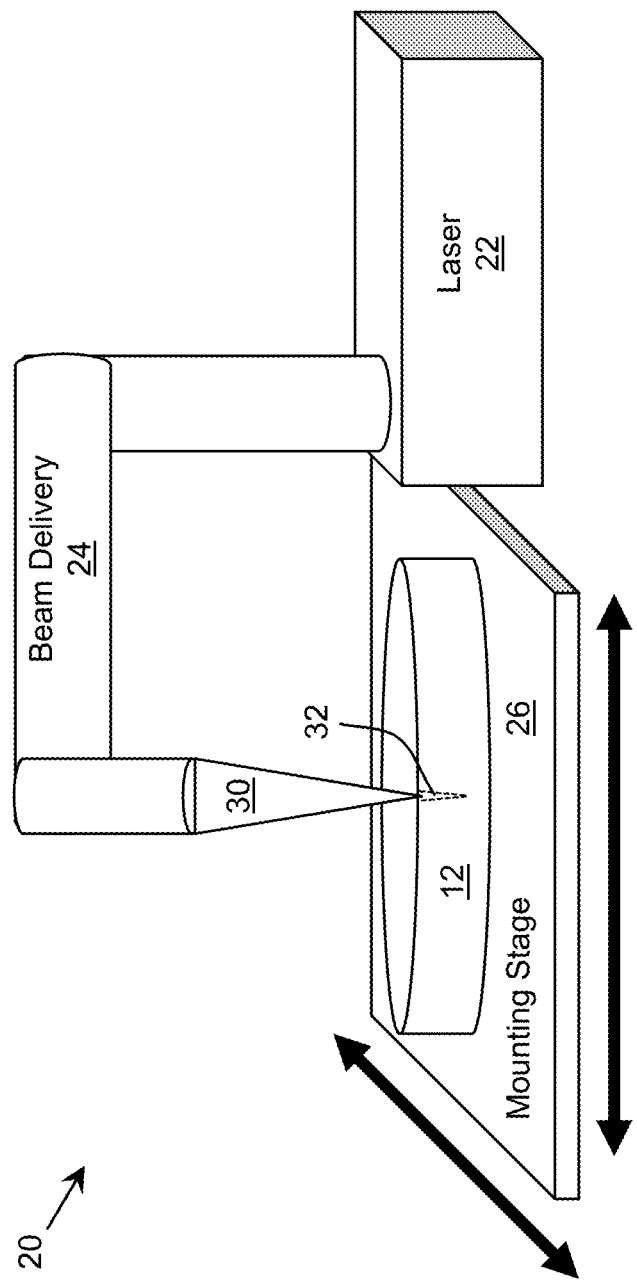

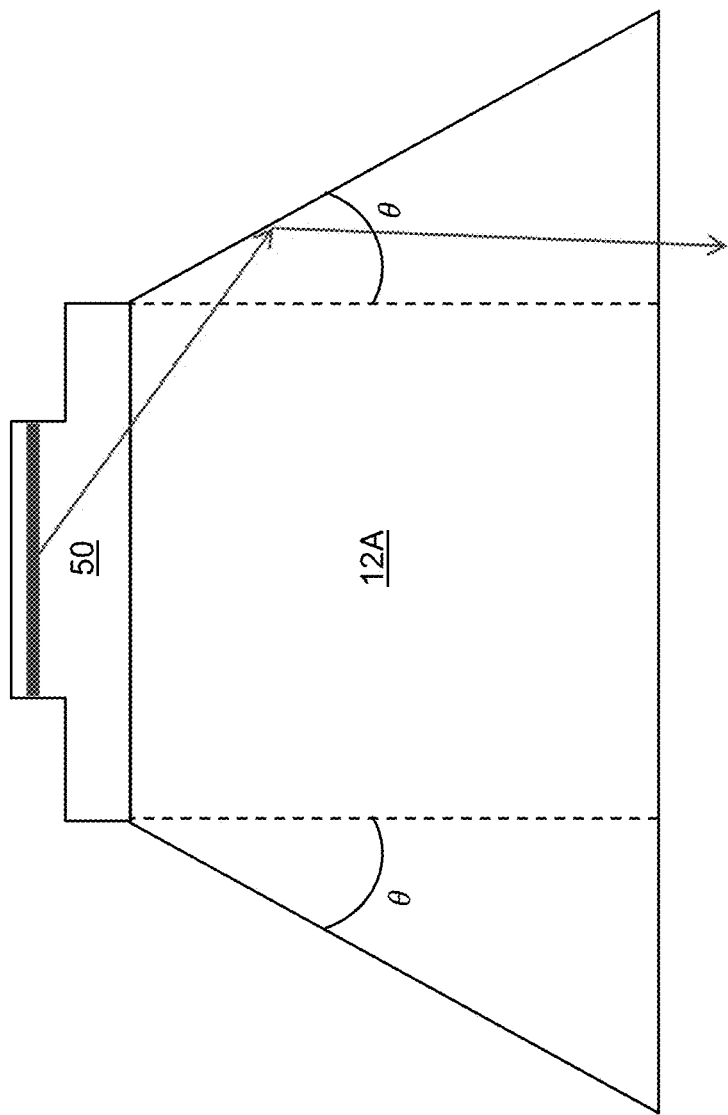

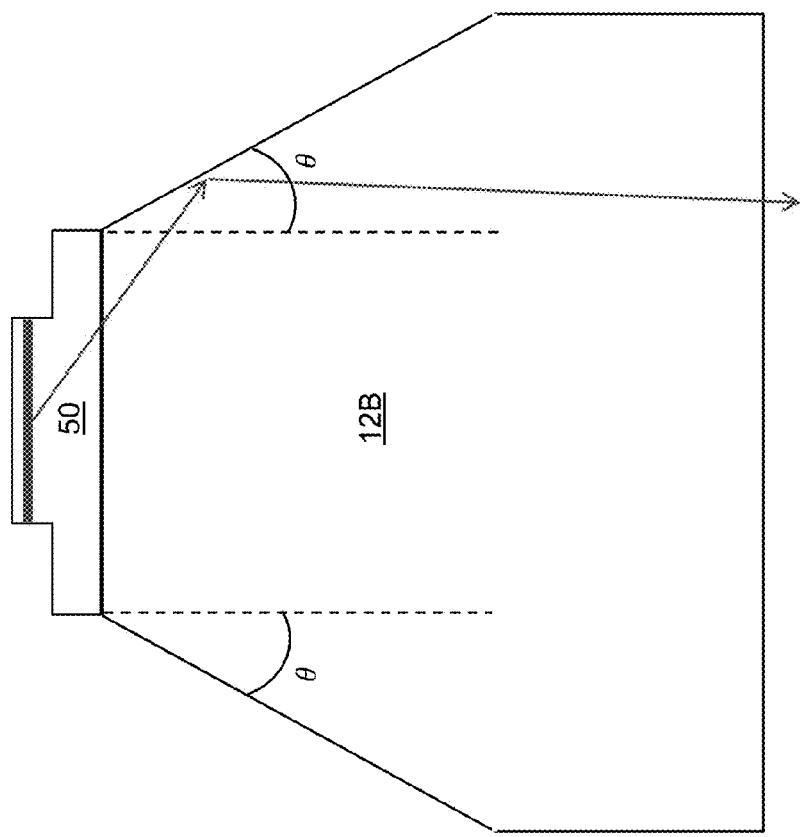

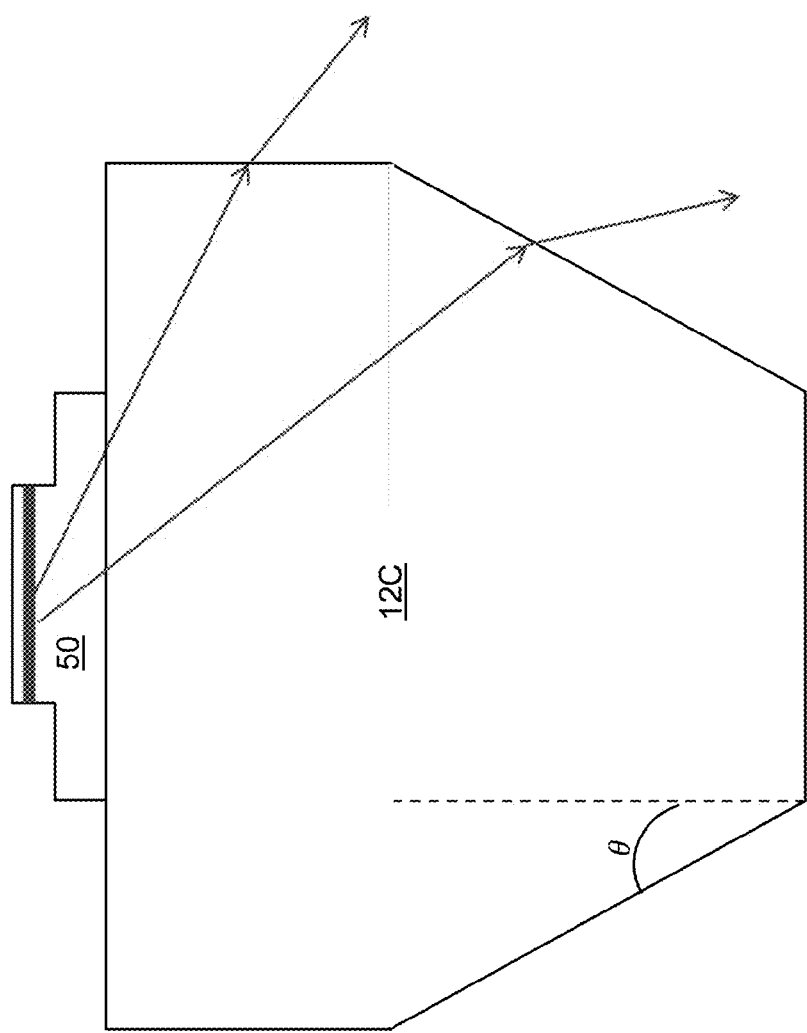

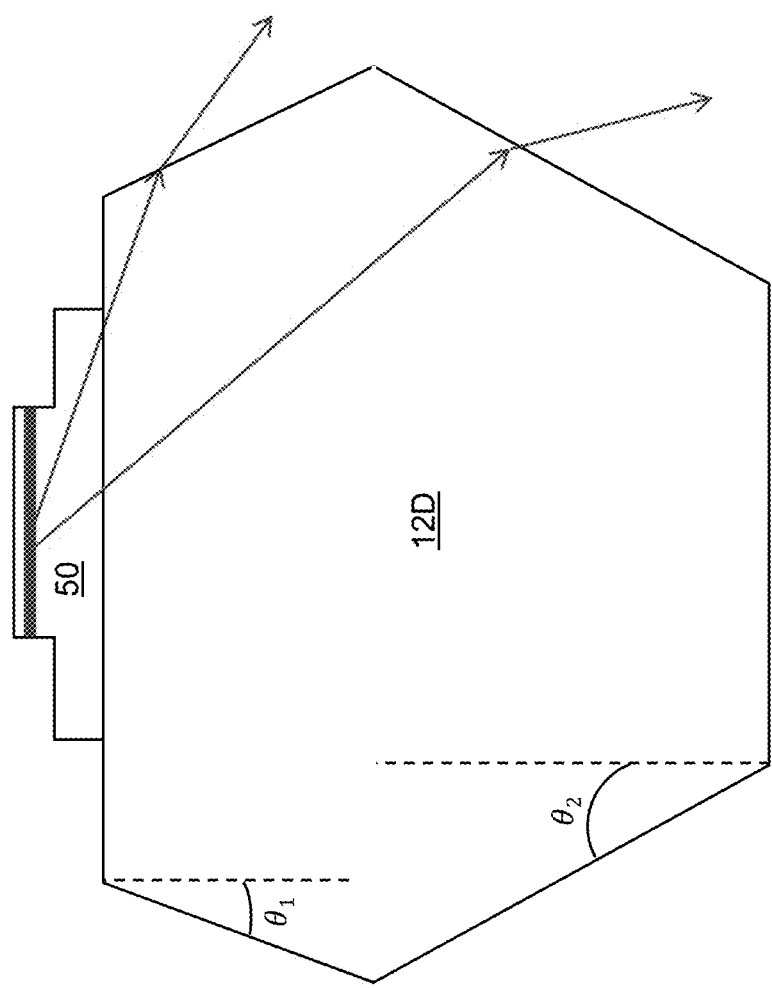

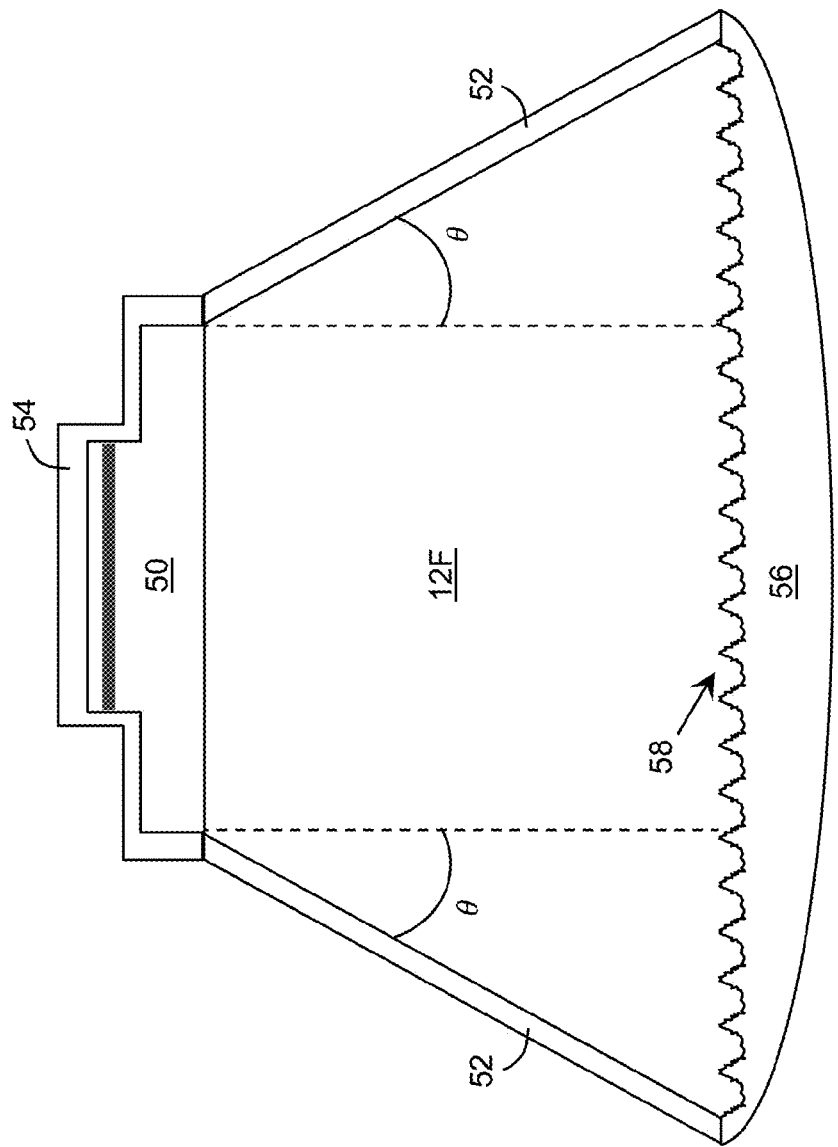

30° Shallow Scribe

30° Deep Scribe

Not Scribed

Vertical Deep Scribe

US 9,595,636 B2

LIGHT EMITTING DEVICE SUBSTRATE WITH INCLINED SIDEWALLS

REFERENCE TO RELATED APPLICATIONS

The current application claims the benefit of U.S. Provisional Application No. 61/617,022, titled "Light Emitting Diode Element and Method for Fabricating the Same," which was filed on 28 Mar. 2012, and which is hereby incorporated by reference.

GOVERNMENT LICENSE RIGHTS

This invention was made with government support under contract no. W911NF-10-2-0023 awarded by the Defense Advanced Research Projects Agency (DARPA). The government has certain rights in the invention.

TECHNICAL FIELD

The disclosure relates generally to light emitting devices, and more particularly, to a solution for improving light extraction efficiency through shaping one or more elements of the device.

BACKGROUND ART

A light emitting diode (LED) is typically composed of semiconductor layers with high indexes of refraction. For example, a group III nitride based LED can have layers with refractive indexes that are typically higher than two. A typical LED emits light uniformly in different directions. However, only some of the light exits the LED structure. A large fraction of emitted light is totally internally reflected and trapped in the semiconductor structure. This light trapping leads to light absorption of the semiconductor layers and contact, which in turn leads to a low light extraction efficiency for the LED.

Many approaches propose to improve light extraction efficiency through surface roughness and the shaping of the LED device. Shaping may be a straightforward and effective approach to increasing the light extraction efficiency of an LED. One approach discusses an LED in a shape of a truncated inverted pyramid, where four faces of an AlGaInP/GaP LED chip are mechanically fabricated to form the truncated inverted pyramid. Using this shape, the external quantum efficiency of the LED was increased. Another approach uses an etching process to fabricate a substrate with inclined faces. In this approach, LED epitaxial layers are selectively grown over the etched regions to obtain a multi-incline light emitting structure without using a mechanical fabrication process.

The use of various LED shapes have been proposed. One approach uses polyhedron chips (rhomboidal and triangular) with parallel bases. For example, FIG. 1A shows a horizontal cross section of a rhomboidal-geometry chip 2 according to the prior art, along with photon trajectories. As illustrated, the chip 2 has a plane deformation angle, $\alpha_h \neq 90°$. The photons that travel parallel to the horizontal plane inevitably escape since each internal reflection reduces the incidence angle by $\alpha_h$. An optimal deformation angle at which only a couple of flights are required for most photons to escape is close to $\alpha_h = 2\Theta_c(n_s, n_e)$, where $\Theta_c$ is the escape cone, $n_s$ is the refractive index of the semiconductor materials, and $n_e$ is the refractive index of the surrounding environment (e.g., air). If, in addition, the sidewalls of the chip are slanted similarly, most of the photons generated would find escape cones regardless of their traveling directions. Increased light extraction efficiency (e.g., up to 120% compared with a rectangular geometry) was shown using a statistical tracing of the photon trajectories. One proposal describes a technique for the fabrication of geometrically deformed chips by slanted sawing of wafers.

FIG. 1B shows a schematic vertical cross section of a truncated inverted pyramid LED 4 according to the prior art. The geometrically deformed LED 4 is formed from an epitaxial AlGaInP structure wafer bonded to a thick GaP substrate. By using a beveled dicing blade, chips with sidewall angles of 35° with respect to the vertical were fabricated. The geometry of the LED 4 is seen to improve light extraction by redirecting totally internally reflected photons from the sidewalls to the top surface or from the top surface to the sidewalls at small incidence angles.

SUMMARY OF THE INVENTION

Aspects of the invention provide a light emitting device having improved light extraction. The light emitting device can be formed by epitaxially growing a light emitting structure on a surface of a substrate. The substrate can be scribed to form a set of angled side surfaces on the substrate. For each angled side surface in the set of angled side surfaces, a surface tangent vector to at least a portion of each angled side surface in the set of angled side surfaces forms an angle between approximately ten and approximately eighty degrees with a negative of a normal vector of the surface of the substrate. The substrate can be cleaned to clean debris from the angled side surfaces.

A first aspect of the invention provides a method comprising: epitaxially growing a light emitting structure on a surface of a substrate; scribing the substrate to form a set of angled side surfaces on the substrate, wherein a surface tangent vector to at least a portion of each angled side surface in the set of angled side surfaces forms an angle between approximately ten and approximately eighty degrees with a negative of a normal vector of the surface of the substrate; and cleaning the substrate and the light emitting structure after the scribing.

A second aspect of the invention provides a method comprising: epitaxially growing a light emitting structure on a surface of a substrate; scribing the substrate to form a set of angled side surfaces on the substrate, wherein a surface tangent vector to a first portion of an angled side surface in the set of angled side surfaces forms a first angle between approximately ten and approximately eighty degrees with a negative of a normal vector of the surface of the substrate, and wherein a surface tangent vector to a second portion of the angled side surface in the set of angled side surfaces forms a second angle between zero and approximately eighty degrees with a negative of a normal vector of the surface of the substrate; and cleaning the substrate and the light emitting structure after the scribing.

A third aspect of the invention provides a method of forming a light emitting device, the method comprising: epitaxially growing a plurality of light emitting structures on a surface of a substrate; scribing the substrate to form a set of angled side surfaces on the substrate for each of the plurality of light emitting structures, wherein, for each of the plurality of light emitting structures, a surface tangent vector to at least a portion of each angled side surface in the set of angled side surfaces forms an angle between approximately ten and approximately eighty degrees with a negative of a normal vector of the surface of the substrate; and cleaning the substrate and the plurality of light emitting structures after the scribing.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 2 shows a two dimensional top view of an illustrative substrate according to an embodiment.

FIGS. 3A and 3B show illustrative configurations of a laser micromachining system according to embodiments.

FIGS. 5A-5F show illustrative substrate configurations according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1B:
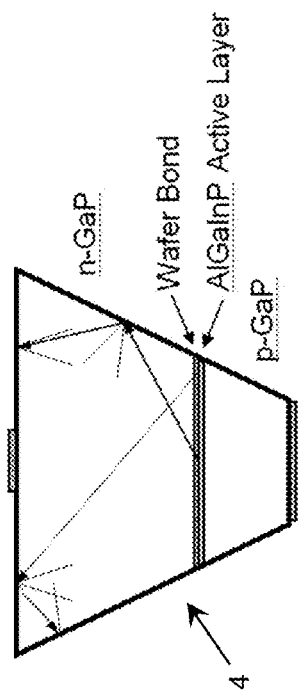
FIGS. 1A and 1B show illustrative device geometries according to the prior art.
Figure 1A:
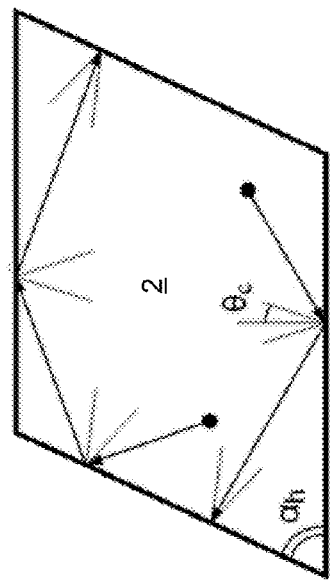

As indicated above, aspects of the invention provide a light emitting device having improved light extraction. The light emitting device can be formed by epitaxially growing a light emitting structure on a surface of a substrate. The substrate can be scribed to form a set of angled side surfaces on the substrate. For each angled side surface in the set of angled side surfaces, a surface tangent vector to at least a portion of each angled side surface in the set of angled side surfaces forms an angle between approximately ten and approximately eighty degrees with a negative of a normal vector of the surface of the substrate. The substrate can be cleaned to clean debris from the angled side surfaces. The inclined sidewalls can mitigate total internal reflection (TIR) and therefore lead to an increase in an overall light extraction efficiency for the device. As used herein, unless otherwise noted, the term "set" means one or more (i.e., at least one) and the phrase "any solution" means any now known or later developed solution.

Initially, a substrate including a set of light emitting structures located on a surface of the substrate is obtained. The substrate can comprise any type of suitable substrate, such as sapphire. However, other types of substrate can be used including, for example, aluminum nitride (AlN), gallium nitride (GaN), AlGaN, zinc oxide (ZnO), lithium gallate (LiGaO$_2$), lithium aluminate (LiAlO$_2$), ScMgAlO$_4$, spinel (MgAl$_2$O$_4$), silicon carbide (SiC), silicon (Si), and/or the like.

Multiple light emitting structures (e.g., dies) can be grown on a single substrate. To this extent, FIG. 2 shows a two dimensional top view of a surface of an illustrative substrate 12 according to an embodiment. In this case, the surface of the substrate 12 includes a plurality of stripes, such as stripes 14A and 14B, of a masking agent (e.g., isolating material) of any type. The masking agent can be placed in any locations on the surface of the substrate 12 where semiconductor film growth is not desired. In an embodiment, the masking agent comprises silicon dioxide. As illustrated, the stripes 14A, 14B can form a plurality of regions, such as regions 16A-16C, in a grid arrangement.

In an embodiment, the surface of one or more of the regions 16A-16C of the substrate 12 can be patterned or roughened using any solution. For example, a patterned surface can be formed using lithography and/or etching. In an embodiment, the patterned surface is formed using photolithography and wet chemical etching. However, it is understood that other types of lithography, such as e-beam, stepper, and/or the like, and/or other types of etching, such as dry etching, can be used. The patterning or roughening can be configured to: provide for relaxation of stress buildup between the substrate 12 and an adjacent layer, such as a buffer layer; yield a semiconductor layer in a light emitting structure having a lower density of dislocations; and/or the like. As illustrated, the patterning/roughening can be different for different regions, such as regions 16A and 16B.

In an embodiment, the set of light emitting structures can be epitaxially grown on the surface of the substrate (e.g., within the regions 16A-16B) using any solution. Illustrative epitaxial growth processes include metalorganic chemical vapor deposition (MOCVD), migration enhanced MOCVD, molecular beam epitaxy (MBE), and/or the like. Each light emitting structure can be formed of any type of light emitting heterostructure. Furthermore, the light emitting structure can include various components to operate the light emitting structure. For example, the light emitting structure can include p-type and n-type doped semiconductor layers, which include a light generating structure formed of a set of quantum wells and barriers (e.g., which can be formed by hetero-epitaxy of semiconductor layers). Additionally, the light emitting structure can include an n-type contact and a p-type contact located adjacent to opposing sides of the light generating structure, thereby forming a light emitting diode.

In an embodiment, the light emitting structure is a group III-V materials based device, in which some or all of the various layers are formed of elements selected from the group III-V materials system. In a more particular illustrative embodiment, the various layers of the light emitting structure are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

In an embodiment, a light emitting structure is configured to operate as a light emitting diode (LED), such as a conventional or super luminescent LED. Alternatively, the light emitting structure can be configured to operate as a laser diode (LD). In either case, during operation of the light emitting structure, application of a bias comparable to the band gap results in the emission of electromagnetic radiation from an active region of the light emitting structure. The electromagnetic radiation emitted by the light emitting structure can comprise a peak wavelength within any range of wavelengths, including visible light, ultraviolet radiation, deep ultraviolet radiation, infrared light, and/or the like.

Figure 3B:
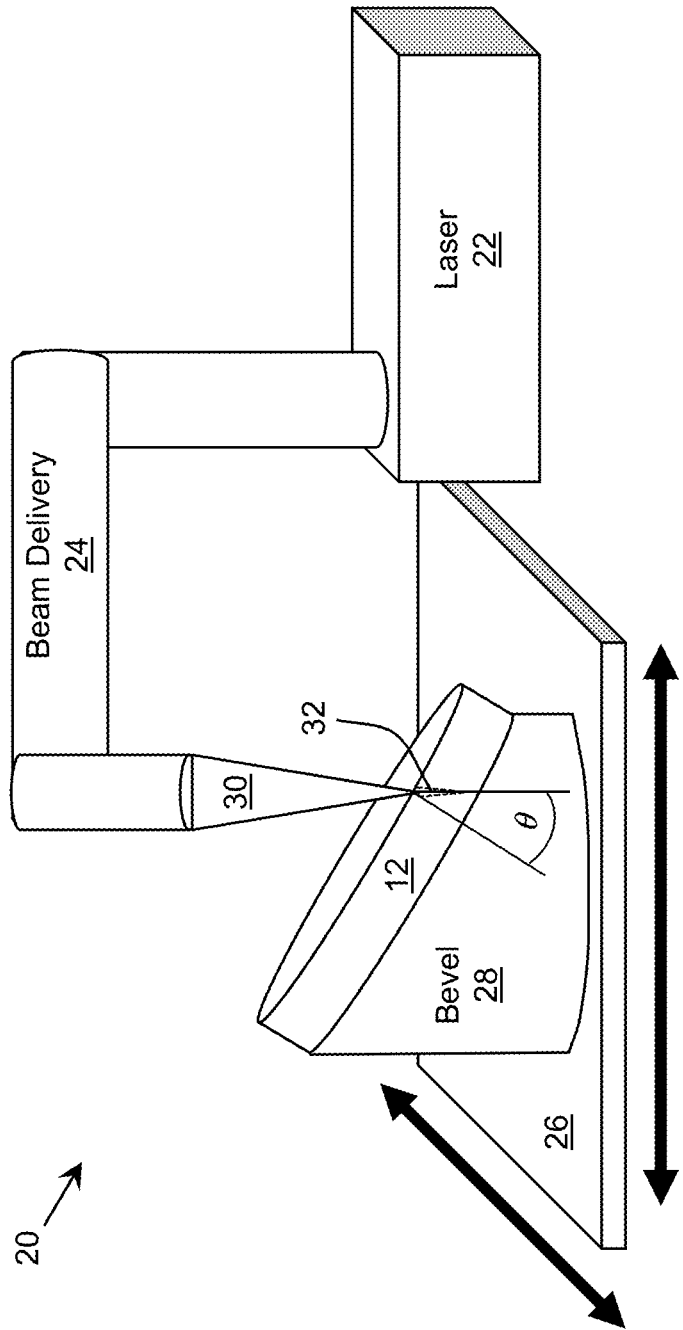

Regardless, after formation of a set of light emitting structures on the substrate 12, a light emitting structure and/or the corresponding substrate 12 can be shaped to improve light extraction from the structure. In an embodiment, the set of light emitting structures and/or the substrate 12 are shaped using a laser micromachining system. To this extent, FIGS. 3A and 3B show illustrative configurations of a laser micromachining system 20 according to embodiments. The laser micromachining system 20 includes a laser 22, a beam delivery component 24, and a mounting stage 26. During operation, the laser 22 generates a laser beam 30, which is directed toward the mounting stage 26 by the beam delivery component 24. The mounting stage 26 can be configured to move in each of four horizontal directions to adjust a location of the mounting stage 26 relative to the laser beam 30 location. In an embodiment, the laser 22 operates at an ultraviolet wavelength and delivers approximately 35 mJ/pulse at an approximately 300 Hertz repetition rate. While the system 20 is shown including a single laser beam 30, it is understood that any number of one or more lasers 22 and/or laser beams 30 can be utilized to scribe the substrate 12. Similarly, while the system 20 is shown having a laser beam 30 that is in a fixed location, it is understood that the system 20 can be implemented with a laser beam 30 that can be moved.

The substrate 12 can be located on the mounting stage 26 and moved with respect to the laser beam 30 by moving the mounting stage 26. To this extent, the substrate 12 can be moved so that the laser beam 30 scribes a set of grooves 32 into the substrate 12. For example, the mounting stage 26 can be moved to cause the laser beam 30 to make vertical and horizontal passes along the grid formed by the stripes 14A, 14B (FIG. 2) of the masking agent to result in straight vertical and horizontal grooves 32 in the substrate 12.

As shown in FIG. 3A, the mounting stage 26 and substrate 12 can be configured so that the grooves 32 formed within the substrate 12 have a substantially vertical orientation. In an embodiment, the system 20 is configured to form grooves 32 within the substrate 12 having any of a plurality of angles. To this extent, as shown in FIG. 3B, the substrate 12 can be mounted on a bevel 28 located on the mounting stage 26. The bevel 28 can have an angled top surface that corresponds to a desired non-vertical angle Θ to be formed in the substrate 12. In this configuration, the mounting stage 26 can be moved with respect to the location of the laser beam 30 to form the grooves 32 of the desired angle. In order to adjust the angle Θ, a different bevel 28 can be used.

In an embodiment, an angled groove 32 is formed by first forming substantially vertical grooves 32 (e.g., as shown in FIG. 3A) having a kerf sufficiently wide to enable the laser beam 30 to pass unobstructed to form the angled groove. Subsequently, the substrate 12 can be angled with respect to the laser beam 30 (e.g., as shown in FIG. 3B), and the angled sides of the grooves 32 can be formed. However, it is understood that this is only illustrative of various solutions for forming grooves 32 having angled sides. For example, in alternative embodiments, one or more of the mounting sage 26, bevel 28, and/or beam delivery component 24 can be configured to be movable in a direction that adjusts an angle of the laser beam 30 with respect to a surface of the substrate 12 to form a groove 32 in the substrate 12 having sides of a desired angle Θ.

After the grooves 32 having sides of the desired angle(s) Θ are formed, the grooves 32 can be cleaned from light absorbing residue using any solution. Illustrative cleaning solutions include, for example: a dry reactive ion etching (RIE), wet etching in a potassium hydroxide (KOH) solution, a phosphoric sulfuric acid, and/or the like, etc. Furthermore, the grooves 32 can be cleaned using a combination of two or more cleaning solutions. In an embodiment, prior to cleaning the grooves 32, one or more surfaces of the substrate 12 and/or light generating structure(s) included thereon, can be protected from etching, e.g., by applying a thin silicon dioxide mask layer over the surface(s).

When a dry RIE etching procedure is utilized to etch the ablated surfaces, an etching area can be opened, e.g., with photolithography, after the surfaces have been laser scribed. A dry RIE etching using, for example, a BCl3/Ck2/Ar chemistry, can be applied to etch the scribed surface(s). When using a KOH wet etching procedure, after the laser scribing, the substrate 12 can be soaked in a diluted KOH solution at room temperature in order to clean the scribed surface(s). The KOH can clean deep laser debris and will not attack the semiconductor layer material located on the substrate 12 at room temperature. Phosphoric sulfuric acid can etch semiconductor layers more than twenty times faster than a substrate material such as sapphire at an elevated temperature. Using a phosphoric sulfuric acid wet etching procedure, a thin layer of silicon dioxide can be deposited on the substrate 12, e.g., using plasma-enhanced chemical vapor deposition (PECVD). A silicon dioxide etching window can be opened using photolithography or the like. The silicon dioxide in the open window can be etched with, for example, a buffered oxide etcher, RIE dry etching, or the like. Subsequently, the substrate 12 can be soaked in phosphoric sulfuric acid at an elevated temperature to clean the scribed surface(s). Experimental results indicate that the use of any of the cleaning procedures described herein can result in similar output power improvement for the light emitting structure.

Figure 4A:
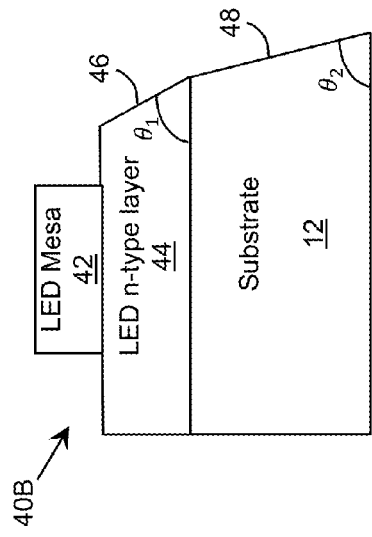
FIGS. 4A-4C show schematics of illustrative light emitting diode dies having angled side surfaces according to embodiments.
Figure 4B:
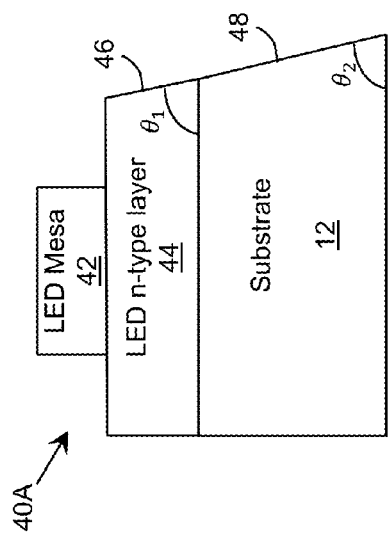
Figure 4C:
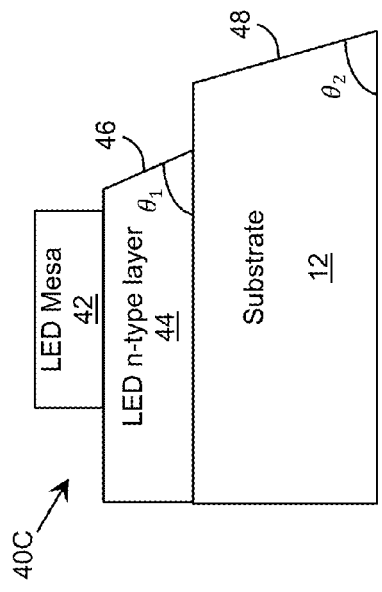

As described herein, the substrate 12 is scribed to form a set of angled side surfaces on the substrate 12, which can be subsequently cleaned to achieve a shape that improves light extraction from the substrate 12. Similarly, one or more of the side surfaces of the light generating structure can be angled to improve light extraction from the light generating structure. To this extent, FIGS. 4A-4C show schematics of illustrative light emitting diode dies 40A-40C having angled side surfaces according to embodiments. In each case, the light emitting diode 40A-40C includes a diode having a mesa structure, which includes an LED mesa 42 and an LED n-type layer 44, which is located on the substrate 12. The LED n-type layer 44 and LED mesa 42 can be formed using any solution, e.g., epitaxially grown on the substrate 12.

As illustrated, the LED n-type layer 44 can have an angled side surface 46 and the substrate 12 can have an angled side surface 48. Similar to the angled side surface 48 of the substrate 12, the angled side surface 46 can be formed using etching, laser scribing, and/or the like. The side surfaces 46, 48 can form inclination angles $\Theta_1$, $\Theta_2$, respectively, with a bottom surface of the respective layers. The side surfaces 46, 48 and inclination angles $\Theta_1$, $\Theta_2$ can have any of various types of relationships. For example, in FIG. 4A, the side surfaces 46, 48 can be substantially aligned, with the inclination angles $\Theta_1$, $\Theta_2$ being substantially equal. In FIG. 4B, the side surface 46 starts at the top edge of the side surface 48, but the inclination angles $\Theta_1$, $\Theta_2$ are different. In FIG. 4C, LED n-type layer 44 does not extend all the way to the end of the substrate 12, and the side surface 46 starts from a top surface of the substrate 12. In this case, the inclination angles $\Theta_1$, $\Theta_2$ can be the same or different.

While each of the light emitting diode dies 40A-40C is shown having a single angled side for the n-type layer 44 and the substrate 12 for clarity, it is understood that each light emitting diode die 40A-40C can have any number of angled sides. Furthermore, while the angled sides 46, 48 are shown on the same side of the light emitting diode dies 40A-40C, it is understood that a side of each light emitting diode die 40A-40C could include only one of the sides, which is angled. Additionally, while the inclination angles $\Theta_1$, $\Theta_2$ are both shown as being less than ninety degrees, it is understood that either inclination angle $\Theta_1$, $\Theta_2$ can be greater than ninety degrees.

As described herein, an angled side can have any angle less than or greater than the normal vector of a top surface of the corresponding layer (e.g., the substrate 12, the n-type layer 44, and/or the like). In an embodiment, a surface tangent vector to the angled side forms an angle between approximately ten and approximately eighty degrees with a negative of a normal vector of a top surface of the corresponding layer. In a more specific embodiment, the angle is approximately thirty degrees. In an embodiment, the substrate sides can be angled to form a truncated inverted pyramid.

Figure 5E:
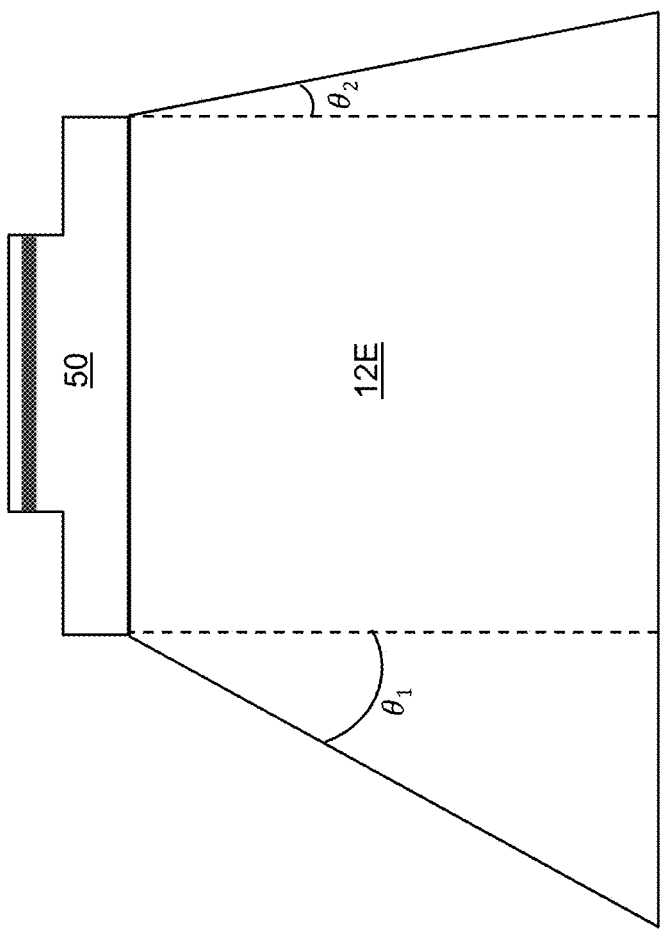

FIGS. 5A-5E show illustrative substrate configurations according to embodiments, along with illustrative photon trajectories. In FIG. 5A, the substrate 12A has angled sides, which form an angle $\Theta$ with a negative of the normal of a surface of the substrate 12A on which the light emitting structure 50 is located. In this case, the angled sides are substantially linear and cause the substrate 12A to have a cross section area that increases with distance from the light generating structure 50. However, it is understood that this is only illustrative, and a cross section area of the substrate 12A can decrease with distance from the light generating structure 50.

In an embodiment, the scribing angle of a side of the substrate can be varied as a function of depth (e.g., distance from the surface on which the light generating structure 50 is located). For example, FIG. 5B shows an illustrative substrate 12B having sides that, for an upper portion of the substrate 12B, form an angle $\Theta$ with the negative of the normal of the top surface of the substrate 12B on which the light emitting structure 50 is located. However, a lower portion of the substrate 12B is substantially perpendicular to the top surface of the substrate 12B.

Similarly, FIG. 5C shows an illustrative substrate 12C having sides in which the upper portion is substantially perpendicular to the top surface of the substrate 12C on which the light emitting structure 50 is located. However, a lower portion of the sides of the substrate 12C form an angle $\Theta$ with the negative of the normal of the top surface of the substrate 12C. FIG. 5D shows an illustrative substrate 12D having sides that, for an upper portion of the substrate 12D, form an angle $\Theta_1$ with a negative of the normal of the top surface of the substrate 12D on which the light emitting structure 50 is located, and for a lower portion of the substrate 12D, form an angle $\Theta_2$ with the negative of the normal of the top surface of the substrate 12D. In this case, the angles $\Theta_1$ and $\Theta_2$ have opposite signs.

In an embodiment, the substrate can include sides that form different angles with a negative of the normal of the top surface of the substrate on which the light emitting structure 50 is located. To this extent, FIG. 5E shows an illustrative substrate 12E having a first side forming an angle $\Theta_1$ with the negative of the normal of the top surface of the substrate 12E and a second side forming an angle $\Theta_2$ with the negative of the normal of the top surface of the substrate 12E. As illustrated, the angles $\Theta_1$ and $\Theta_2$ are different. In an embodiment, the angles $\Theta_1$ and $\Theta_2$ are selected to control a light intensity distribution pattern for the device.

A device described herein can undergo additional processing, which can adjust one or more aspects of the emission of light from the device. To this extent, FIG. 5F shows an illustrative substrate 12F wherein the angled side surfaces are covered with a material 52. In an embodiment, the material 52 comprises a reflective coating. In an embodiment, the reflective coating is an ultraviolet reflective coating and contains aluminum, rhodium, or both. In another embodiment, the reflective coating is approximately ninety percent reflective of the light emitted by the light emitting structure. Inclusion of such a reflective coating can increase the focusing power of the LED device. While two angled side surfaces are shown completely covered with the reflective coating, it is understood that embodiments can include any number of one or more angled side surfaces completely or only partially covered with the reflective coating. Similarly, it is understood that some or all of the light emitting structure 50 can be covered with a material 54, which also can comprise a reflective coating in an embodiment.

In an embodiment, one or more surfaces of the substrate 12F and/or the light emitting structure 50 is covered with a material having a refraction index at a peak wavelength of light emitted by the light emitting structure 50, which is between the corresponding refraction indices of the substrate 12F and the surrounding environment (e.g., air). In this case, one or more of the materials 52, 54, and 56 can comprise such a refraction index. In a more specific embodiment, both the substrate 12F and the light emitting structure 50 are encapsulated by the material. In a still more specific embodiment, the material is a composite material including a matrix material and a filler material. In this case, illustrative bonding materials for the matrix material include a sol-gel, silicone, an amorphous fluoropolymer, an epoxy, and/or the like, and illustrative materials for the filler materials include nanoparticles and/or microparticles formed of alumina sol-gel glass, alumina aerogel, sapphire, aluminum nitride (e.g., single crystal aluminum nitride), boron nitride (e.g., single crystal boron nitride), fused silica, and/or the like. In a further embodiment, one or more sides of the material, such as the material 56 covering a bottom of the substrate 12F, can be shaped to form a lens controlling an angular light emission pattern for the device. Furthermore, one or more of the materials 52, 56 can comprise a material, such as a phosphor (e.g., such as those used in white light emitting diodes), which fluoresces at a wavelength longer than the peak wavelength of the light emitted by the light emitting structure 50.

In an embodiment, one or more surfaces of the substrate 12F can be further configured based on a set of desired device characteristics. For example, a bottom surface 58 of the substrate 12F is shown having been roughened. The roughening can be configured to improve an extraction of light from the substrate 12F, e.g., by further mitigating the TIR, and/or the like. In an embodiment, the roughening forms a photonic crystal. In another embodiment, the roughening has two scales, where one scale is larger than the peak emission wavelength of the light emitted by the light emitting structure 50 (e.g., by approximately an order of magnitude) and a second scale is on the order of the peak emission wavelength. While the device is shown having a roughened bottom surface 58, it is understood that any combination of one or more surfaces of the substrate 12F can be roughened, including one or more of the angled side surfaces. In another embodiment, one or more wave guiding structures, such as optical fibers, can be attached to a surface of the substrate 12F, such as the bottom surface 58.

Figure 6B:
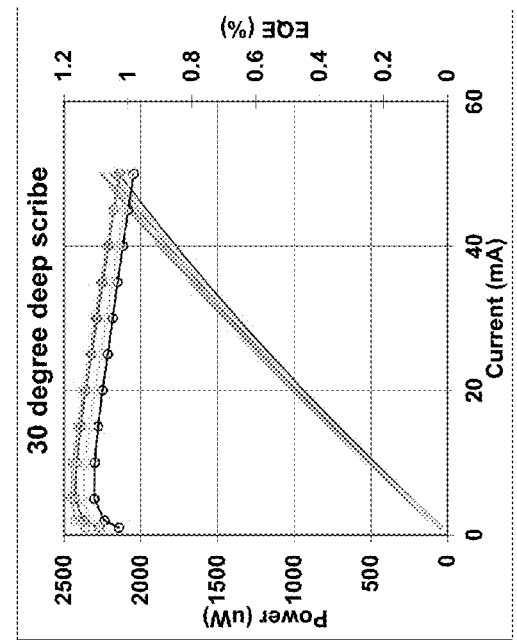
FIGS. 6A-6D show power and external quantum efficiency of light emitting structures for different scribing procedures.
Figure 6A:
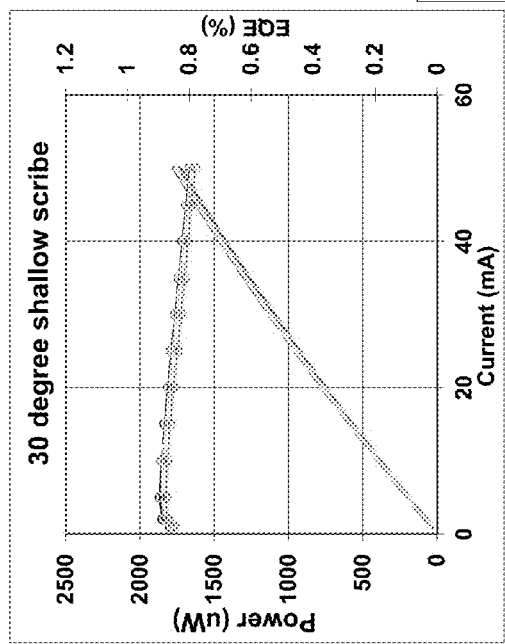
Figure 6D:
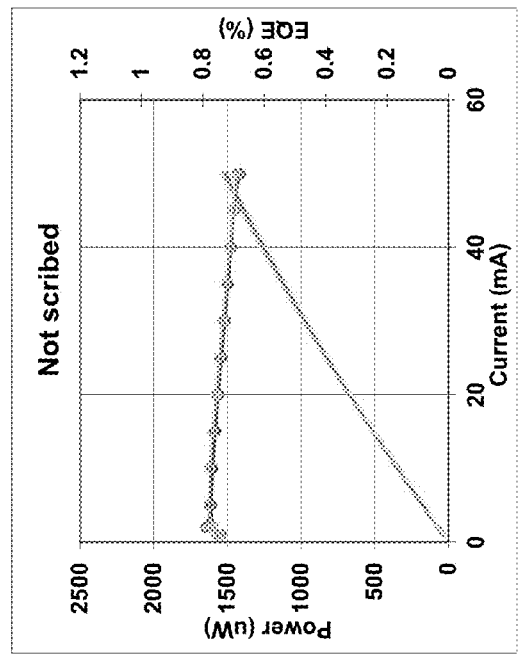
Figure 6C:
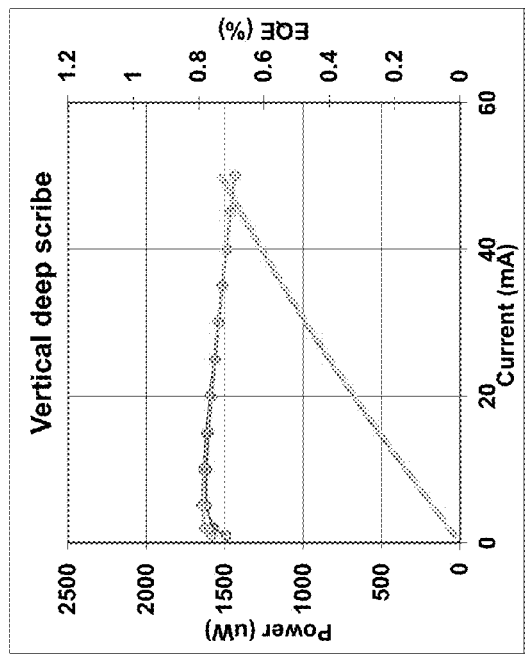

Various devices were fabricated and evaluated for the effects of different scribing procedures. In particular, a wafer containing a large number of LED dies grown on a sapphire substrate was evaluated. Each LED die was a deep ultraviolet LED emitting ultraviolet light having a peak wavelength of approximately 275 nanometers. FIGS. 6A-6D show power (left axis, diagonal line, in micro-watts) and external quantum efficiency (EQE, circle data, right axis) of the light emitting structures for different scribing procedures. In particular, FIG. 6A shows the result of shallow scribing at a thirty degree angle; FIG. 6B shows the result of deep scribing at thirty degree angle; FIG. 6C shows the result of performing a deep vertical scribing (e.g., a zero degree angle); and FIG. 6D shows the result when no scribing is performed. As illustrated, the light extraction efficiency and power increased after both of the angled scribing procedures (e.g., by more than forty percent for some LED devices after the deep scribing at a thirty degree angle). However, the vertical scribing had nearly no effect on the power or light extraction efficiency.

Figure 7B:
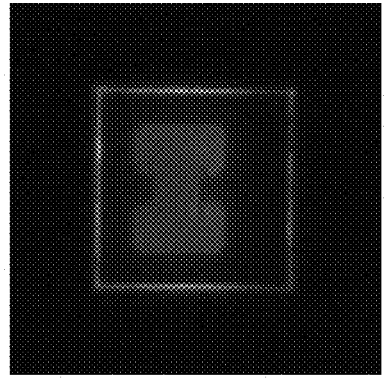
FIGS. 7A-7D show the emission of light from illustrative LED devices evaluated for different scribing procedures.
Figure 7D:
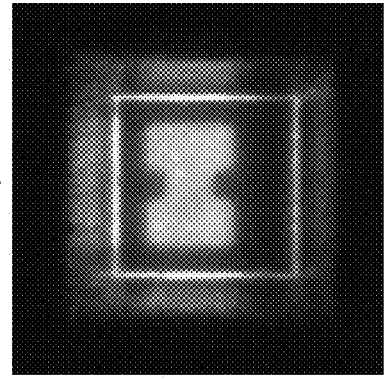
Figure 7A:
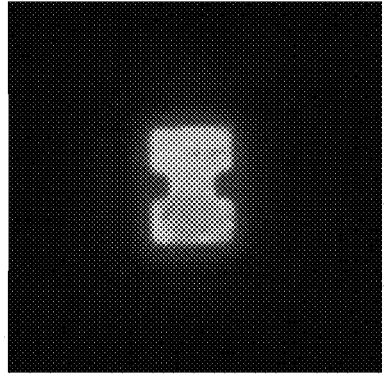
Figure 7C:
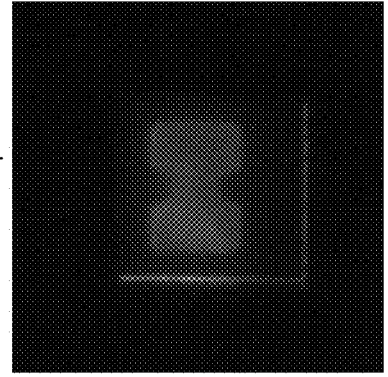

Similarly, FIGS. 7A-7D show the emission of light from illustrative LED devices evaluated for different scribing procedures. In particular, FIG. 7A shows the emission of light from an LED with a substrate having no scribing; FIG. 7B shows the emission of light from an LED with a substrate having a thirty degree shallow scribing; FIG. 7C shows the emission of light from an LED with a substrate having a vertical deep scribing; and FIG. 7D shows the emission of light from an LED with a substrate having a thirty degree deep scribing. As illustrated, the light emission from the LED with the substrate having a thirty degree deep scribing is substantially increased from each of the other scribing procedures.

Figure 8:
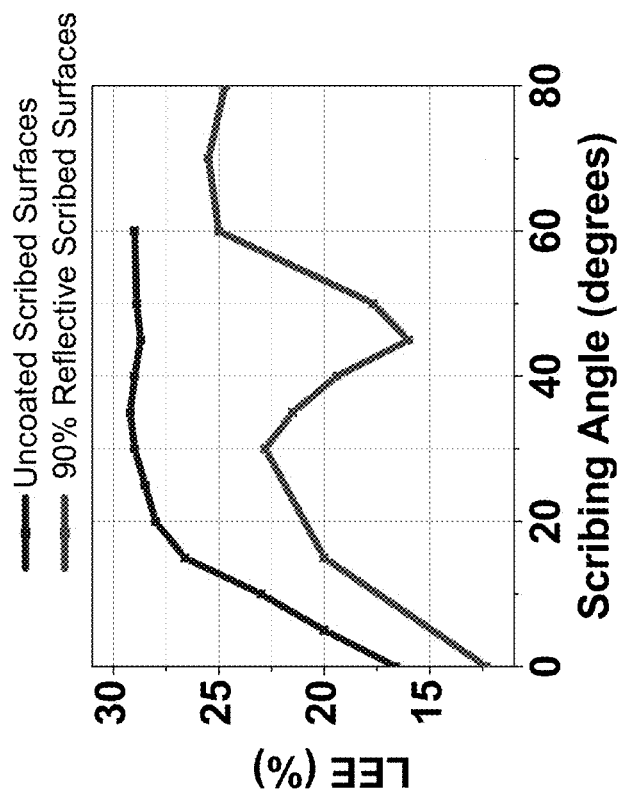
FIG. 8 shows light extraction efficiencies obtained through ray tracing simulations of a deep ultraviolet LED device for scribed surfaces of varying angles with and without reflective coating.

FIG. 8 shows light extraction efficiencies obtained through ray tracing simulations of a deep ultraviolet LED device for scribed surfaces of varying angles with and without reflective coating. As illustrated, for uncoated scribed surfaces, the preferred angle of substrate scribing is approximately thirty degrees. However, when the scribed surfaces are coated with a reflective coating, the angle of substrate scribing has a first peak at approximately thirty degrees and a second peak at approximately sixty degrees.

Figure 9B:
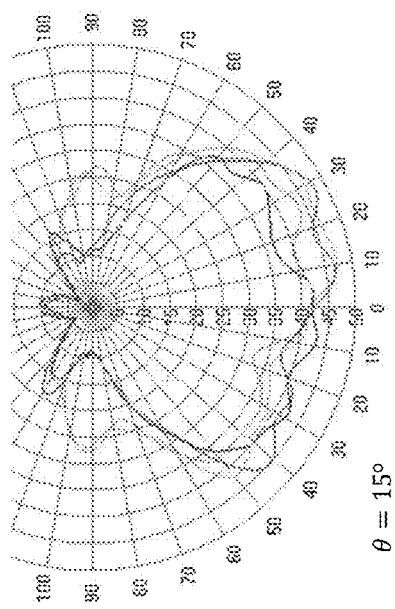
FIGS. 9A-9H show polar distributions of illustrative LED devices with substrates having angled sides of various illustrative angles according to embodiments.
Figure 9A:
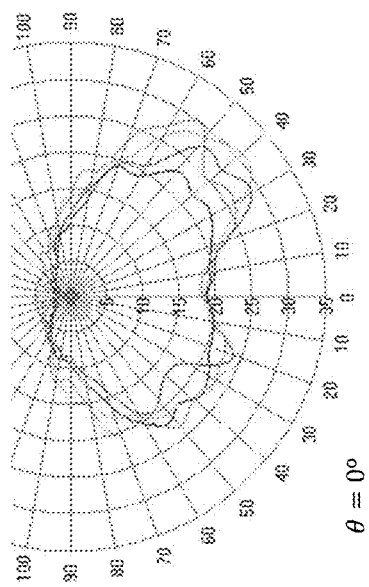
Figure 9D:
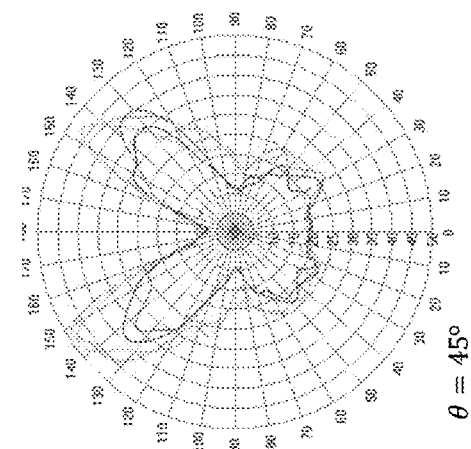
Figure 9C:
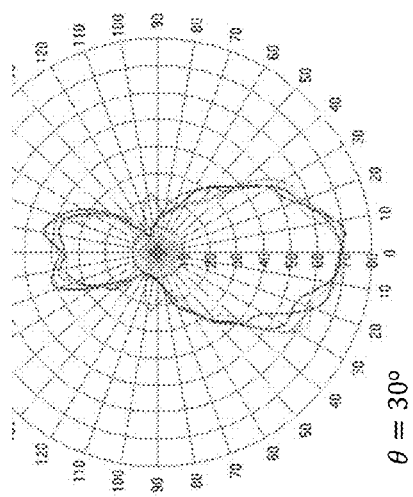
Figure 9F:
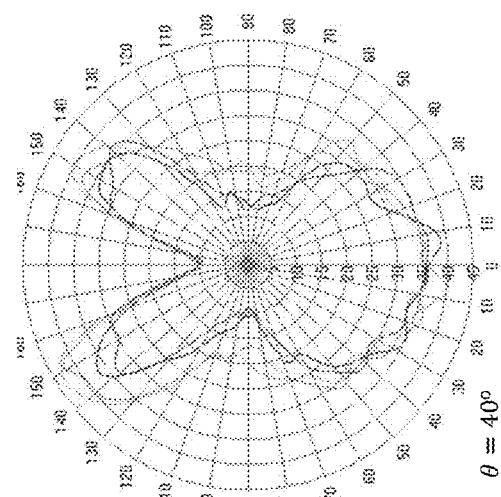
Figure 9E:
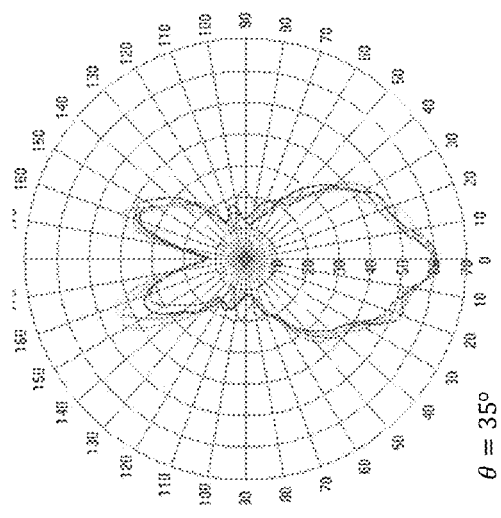
Figure 9H:
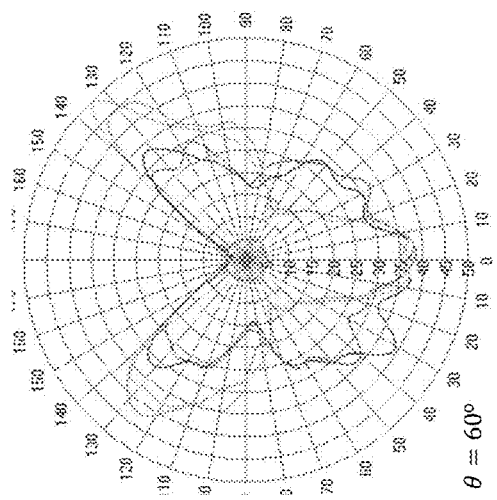
Figure 9G:
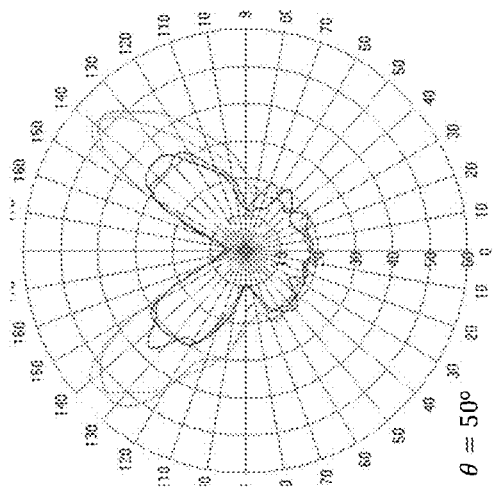
Figure 10A:
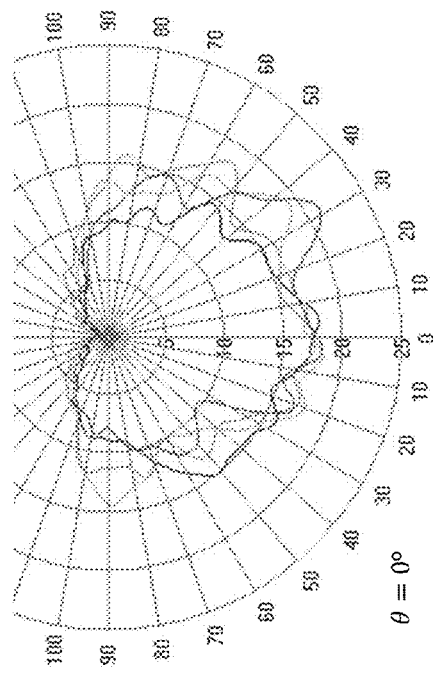
FIGS. 10A-10D show polar distributions of illustrative LED devices with substrates having angled sides of various illustrative angles covered with a reflective coating according to embodiments.
Figure 10B:
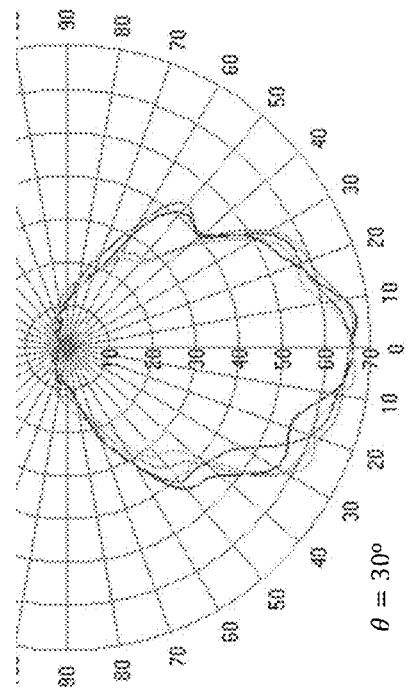
Figure 10D:
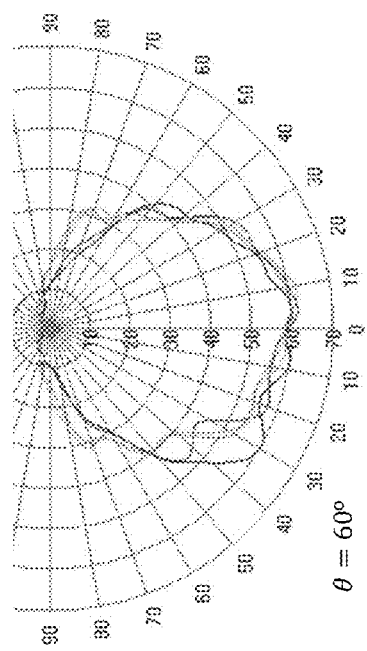
Figure 10C:
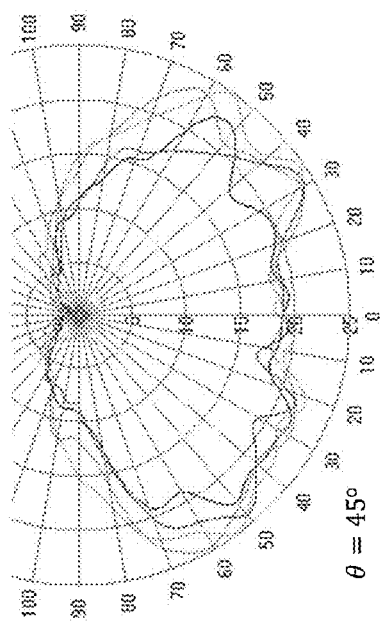

FIGS. 9A-9H show polar distributions of illustrative LED devices with substrates having angled sides of various illustrative angles according to embodiments. FIG. 9A shows the polar distribution for a vertical side. As illustrated, the polar distribution of the radiated light becomes more widespread and is significantly increased for the devices with the angled sides. FIGS. 10A-10D show polar distributions of illustrative LED devices with substrates having angled sides of various illustrative angles covered with a reflective coating according to embodiments. The reflective coating is approximately ninety percent reflective of the light emitted by the LED. As illustrated in FIGS. 10B (angled sides of thirty degrees) and 10D (angled sides of sixty degrees), the corresponding LEDs have a relatively focused emission with an overall high extraction efficiency.

While various aspects of the invention have been shown and described with respect to a light emitting structure, such as an LED, it is understood that the teachings of the invention can be applied to various types of devices, which can be formed from one or more light emitting structures. For example, an embodiment of a device can include two or more devices monolithically integrated on the same substrate (e.g., formed within the same region as shown in FIG. 2). To this extent, the two devices can include two or more light emitting structures. In this case, the light emitting structures can form an LED lamp, or the like. The light emitting structures can form arrays where each light emitting structure and its corresponding underlying substrate is scribed at a set of angles specific to the light emitting structure. The set of angles can be selected for each light emitting structure to, for example, control an emitting pattern of the overall device (e.g., the LED lamp).

Furthermore, a device can include one or more other types of devices for which operation of the device is affected by light. For example, an embodiment can include a photodetector and/or a light emitting structure capable of being biased to operate as a photodetector, which is monolithically integrated on the same substrate. Furthermore, a device described herein can be configured to operate as a sensing device. For example, a set of channels and/or cavities can be formed in the substrate, within which a medium can be placed. The medium can comprise any type of medium, including a solid, a polymer, a liquid, a gas, and/or the like. The sensing can be performed based on, for example, a presence of a material that is altered by and/or alters the corresponding light emitted by the light emitting structure. To this extent, the formation of such a device can include monolithically integrating one or more photodetectors on the substrate, which can be configured to detect changes to the light and/or material.

Figure 11:
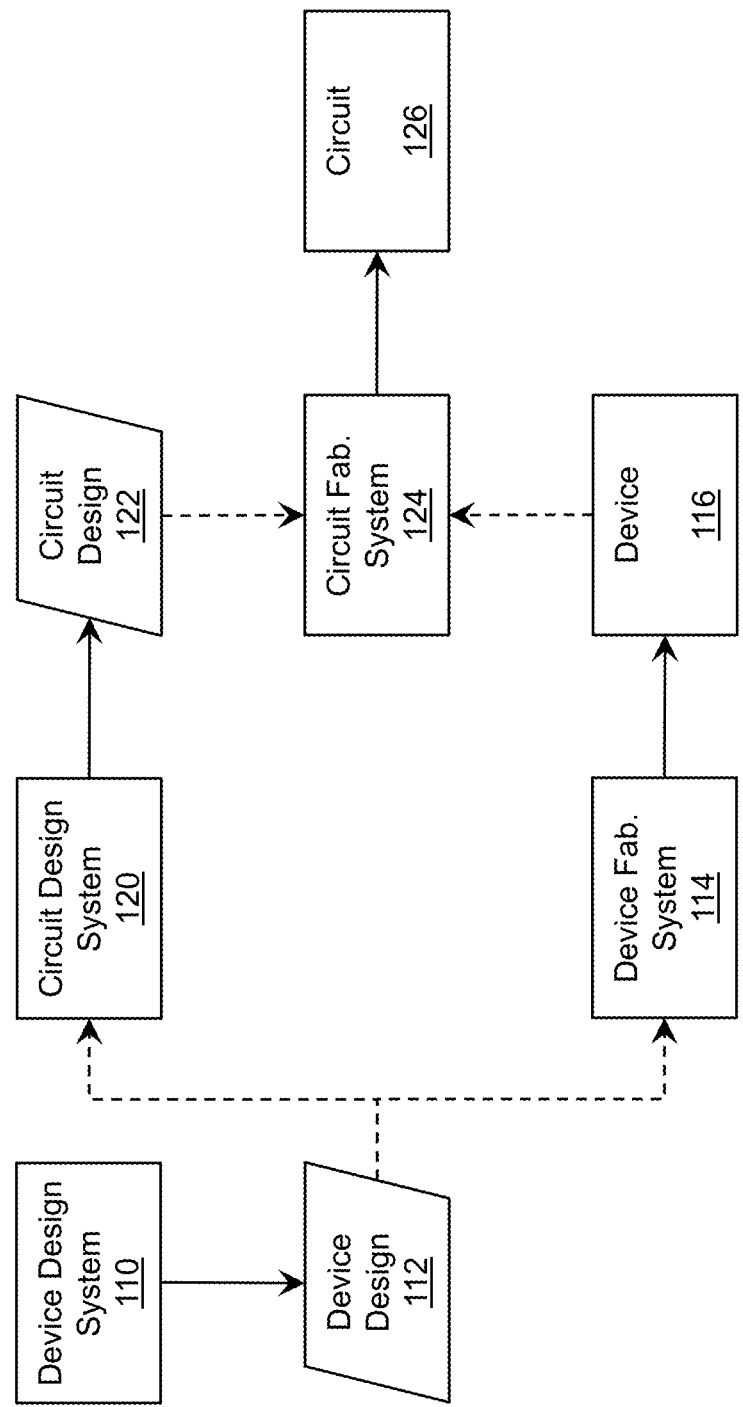
FIG. 11 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 11 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method comprising:
   epitaxially growing a light emitting structure on a growth surface of a substrate;
   scribing the substrate to form a first widening angled side surface, wherein the first widening angled side surface extends from the growth surface of the substrate on which the light emitting structure is grown, wherein the first widening angled side surface forms a first angle with a negative of a normal vector of the growth surface of the substrate that is approximately thirty degrees, and wherein the first widening angled side surface causes at least a portion of the substrate to widen in a direction away from the light emitting structure;
   forming a second widening angled side surface on the light emitting structure, wherein the second widening angled side surface forms a second angle with the normal vector of the growth surface of the substrate, wherein the first angle and the second angle are different; and
   cleaning the substrate and the light emitting structure after the scribing and the forming.

2. The method of claim 1, wherein the cleaning includes placing the substrate in a potassium hydroxide solution.

3. The method of claim 1, further comprising forming a light emitting diode from the light emitting structure and substrate.

4. The method of claim 1, further comprising at least partially coating the first widening angled side surface with a reflective coating.

5. The method of claim 1, wherein the second angle of the second widening angled side surface is larger than the first angle.

6. The method of claim 1, further comprising masking the first widening angled side surface prior to the cleaning.

7. The method of claim 1, further comprising encapsulating the substrate with an encapsulant, wherein the encapsulant has a refraction index between a refraction index of the substrate and a refraction index of air for light having a wavelength corresponding to a wavelength of light emitted by the light emitting structure.

8. The method of claim 7, wherein the encapsulating includes forming a lens with the encapsulant to control an angular light emission pattern for the light emitting structure.

9. The method of claim 1, wherein the scribing of the first widening angled side surface varies as a function of a depth of the substrate from the growth surface.

10. The method of claim 1, further comprising roughening the first widening angled side surface.

11. The method of claim 1, wherein the scribing is performed using a set of lasers and means for adjusting an angle between a top surface of the substrate and the set of lasers.

12. The method of claim 11, wherein the scribing includes:
   adjusting the angle between the top surface of the substrate and the set of lasers to create the first angle between the set of lasers and the negative of the normal vector of the growth surface of the substrate; and
   forming, after the adjusting, the first widening angled side surface of the substrate using the set of lasers.

13. A method comprising:
   epitaxially growing a light emitting structure on a growth surface of a substrate;
   scribing the substrate to form a first widening angled side surface on the substrate using a set of lasers and means for adjusting an angle between a top surface of the substrate and the set of lasers, wherein the first widening angled side surface includes a first portion extending from the growth surface of the substrate on which the light emitting structure is grown, the first portion forming a first angle of approximately thirty degrees with a negative of a normal vector of the growth surface of the substrate, wherein the first portion of the angled side surface causes the substrate to widen in a direction away from the light emitting structure, the first widening angled side surface further including a second portion extending from the first portion, the second portion forming a second angle with the negative of the normal vector of the growth surface of the substrate;

forming a second widening angled side surface on the light emitting structure, wherein the third widening angled side surface forms a third angle with the normal vector of the growth surface of the substrate, wherein the first angle and the second angle are different; and cleaning the substrate and the light emitting structure after the scribing and the forming.

14. The method of claim 13, wherein the second portion of the first widening angled side surface causes the substrate to narrow in a direction away from the direction that the first portion widens from the light emitting structure.

15. The method of claim 13, wherein the cleaning includes placing the substrate in a potassium hydroxide solution.

16. A method of forming a light emitting device, the method comprising:

epitaxially growing a plurality of light emitting structures on a growth surface of a substrate;

scribing the substrate to form a first widening angled side surface on the substrate for each of the plurality of light emitting structures, wherein the first widening angled side surface for each of the plurality of light emitting structures forms a first angle with a negative of a normal vector of the growth surface of the substrate that is approximately thirty degrees, wherein the first widening angled side surface extends from the growth surface of the substrate on which each of the plurality of light emitting structures are grown, and wherein the first widening angled side surface causes the substrate to widen in a direction away from each of the plurality of light emitting structures;

forming a second widening angled side surface on each of the plurality of light emitting structures, wherein the second widening angled side surface forms a second angle with the normal vector of the growth surface of the substrate, wherein the first angle and the second angle are different; and cleaning the substrate and the plurality of light emitting structures after the scribing and the forming.

17. The method of claim 16, wherein at least one of the plurality of light emitting structures is capable of being operated as a photodetector.

18. The method of claim 16, further comprising selecting at least one of: the first angle or the second angle, for each of the plurality of light emitting structures according to a target emission pattern of the light emitting device.

* * * * *